(12) United States Patent  
Ravi et al.

(10) Patent No.: US 6,924,170 B2  
(45) Date of Patent: Aug. 2, 2005

(54) DIAMOND-SILICON HYBRID INTEGRATED HEAT SPREADER

(75) Inventors: Kramadhati V. Ravi, Atherton, CA (US); James G. Maveety, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/610,347

(22) Filed: Jun. 30, 2003

(65) Prior Publication Data

US 2004/0266056 A1 Dec. 30, 2004

(51) Int. Cl.[7] .................................................. H05K 7/20
(52) U.S. Cl. ....................................... 438/105; 165/185
(58) Field of Search ........................... 438/105; 257/77, 257/49; 165/185

(56) References Cited

U.S. PATENT DOCUMENTS 5,354,717 A * 10/1994 Pollock et al. .............. 438/125

* cited by examiner

Primary Examiner—Roy Potter  
(74) Attorney, Agent, or Firm—Schwegman, Lundberg, Woessner & Kluth, P.A.

(57) ABSTRACT

An electronic device includes a die further having a first major surface, and a second major surface. The electronic device also includes a plurality of connectors associated with the first major surface of the die, and an integrated heat spreader in thermally conductive relation with the second major surface of the die. The integrated heat spreader also has a layer of silicon, and a layer of diamond attached to the layer of silicon. The first major surface of the die attached to a printed circuit board. A method for forming a heat dissipating device includes placing a layer of diamond on a silicon substrate, and thinning the silicon substrate. The substrate is diced to form a plurality of heat dissipating devices sized to form a thermally conductive connection to a die. A surface of the silicon substrate is placed in thermal communication with a source of heat.

22 Claims, 5 Drawing Sheets

DIAMOND-SILICON HYBRID INTEGRATED HEAT SPREADER

FIELD OF THE INVENTION

The present invention is related to a heat dissipation system and method for an integrated circuit assembly. More specifically, the present invention relates to a diamond-silicon hybrid integrated heat spreader.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. As integrated circuit devices, microprocessors and other related components are designed with increased capabilities and increased speed, additional heat is generated from these components. As packaged units and integrated circuit die sizes shrink, the amount of heat energy given off by a component for a given unit of surface area is also on the rise. The majority of the heat generated by a component, such as a microprocessor, must be removed from the component to keep the component at an operating temperature. If the heat generated is not removed from the component, the heat produced can drive the temperature of the component to levels that result in failure of the component. In some instances, the full capability of certain components can not be realized since the heat the component generates at the full capability would result in failure of the component.

A seemingly constant industry trend for all electronic devices, and especially for personal computing, is to constantly improve products by adding increased capabilities and additional features. For example, the electronics industry has seen almost a 50 fold increase in processing speed over the last decade. Increasing the speed of a microprocessor increases the amount of heat output from the microprocessor. Furthermore, as computer related equipment becomes smaller and more powerful, more components are being used as part of one piece of equipment. As a result, the amount of heat generated on a per unit volume basis is also on the increase. A portion of an amount of heat produced by semiconductors and integrated circuits within a device must be dissipated to prevent operating temperatures that can potentially damage the components of the equipment, or reduce the lifetime of the individual components and the equipment.

An integrated circuit has a front side and a back side. The front side of the integrated circuit includes leads for inputs, outputs and power to the integrated circuit. Leads include many forms, including pins and balls in a ball grid array. The leads of an integrated circuit are attached to pads on another device such as a printed circuit board. For example, an integrated circuit that includes a die having a microprocessor therein has a front side that is attached to the pads on a motherboard. A heat sink is attached to the back side of the integrated circuit. In other words, the heat sink is attached to the back side major surface and extends away from a printed circuit board to which the integrated circuit is mounted. Therefore, generally a major portion of the heat generated is extracted from the back side of the integrated circuit with the die therein.

There is generally a limitation on the amount of heat that can be extracted from the back side of the integrated circuit die, because of the thermal resistance induced by the thermal interface materials (such as a silicon die, any thermal grease, adhesives or solders) used between the back side of the integrated circuit die and the heat sink. Most heat sinks are formed from copper or aluminum. The materials used currently as heat sinks have a limited ability to conduct heat. Relatively large fin structures are also provided to increase the amount of heat removed via conduction. Fans are also provided to move air over the fin structures to aid in the conduction of heat. Increasing the size of the fin structure increases the volume of the heat sink, and generally also increases the stack height of the heat sink. In many electronic devices, the overall size of the heat sink is generally limited by volume constraints of the housing. For example, in some mobile products such as laptop computers and ultra-mobile computers, small stack heights are required.

The use of aluminum and copper heat sinks with fin structures are now approaching their practical limits for removal of heat from a high performance integrated circuit, such as the integrated circuits that include dies for microprocessors. When heat is not effectively dissipated, the dies develop "hot spots" or areas of localized overheating. Ultimately, the circuitry within the die fails. When the die fails, the electrical component also fails.

In some instances, aluminum and copper heat sinks are replaced with a diamond heat sink. Diamond heat sinks are difficult to manufacture. One aspect of a diamond heat sink is that one major surface of the heat sink must be ground smooth to provide a good thermal connection at a thermal interface. Grinding or smoothing diamond is time consuming. Diamond heat sinks are also expensive.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
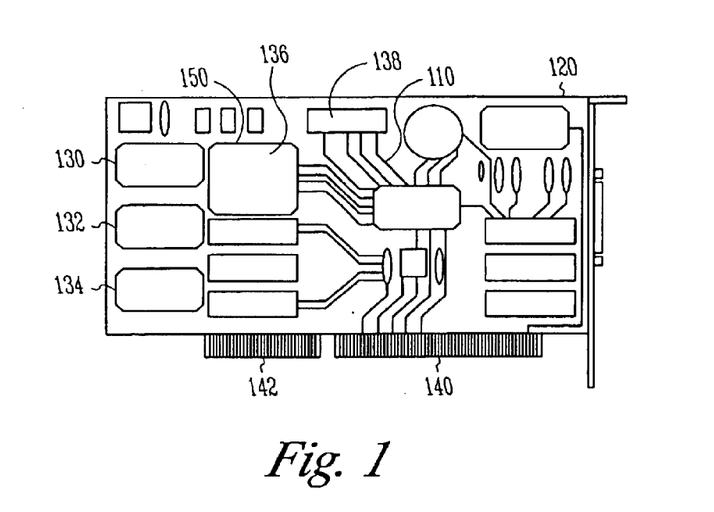
FIG. 1 is a top view of a printed circuit board having a component with a diamond-silicon hybrid integrated heat spreader, according to an embodiment of this invention.

FIG. 1 is a top view of a printed circuit board 100 having a component with a diamond-silicon hybrid integrated heat spreader, according to an embodiment of the invention. The printed circuit board ("PCB") 100 is a multi-layer plastic board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of the printed circuit board 100 and also can be found on the various layers within the printed circuit board 100. Printed circuit boards also include through holes (not shown in FIG. 1) which are used to interconnect traces on various layers of the printed circuit board 100. The printed circuit board 100 can also include planes of metallized materials such as ground planes, power planes, or voltage reference planes (not shown in FIG. 1).

The printed circuit board 100 is also populated with various components 130, 132, 134, 136, 138. The components 130, 132, 134, 136, 138 can either be discreet components or semiconductor chips which include thousands of transistors. The components 130, 132, 134, 136, 138 can use any number of technologies to connect to the exterior surface 120 of the printed circuit board 100. For example, pins may be inserted into plated through holes or pins may be extended through the printed circuit board 100. An alternative technology is surface mount technology where an electrical component, such as component 136, mounts to an array of pads on the exterior surface 120 of the printed circuit board 100. For example, component 136 could be a ball grid array package or device that has an array of balls or bumps that interact or are connected to a corresponding array of pads on the exterior surface 120 of the printed circuit board 100. The printed circuit board 100 can also include connectors for making external connections to other electrical or electronic devices. The component 136 is a central processing chip or microprocessor. The component 136 includes a diamond-silicon hybrid integrated heat spreader 150. The diamond-silicon hybrid integrated heat spreader 150 is attached to the back side of the component 136. The diamond-silicon hybrid integrated heat spreader 150 removes heat from the component 136. The diamond-silicon hybrid integrated heat spreader 150 may also be referred to as a heat sink 150 or an integrated heat sink 150 within this document. It should be noted that the diamond-silicon hybrid integrated heat spreader 150 can be attached to any of the components 130, 132, 134, 136, 138 and is not limited to attachment only to the component 136 which is a central processing chip or microprocessor. Generally, however, a microprocessor is a component that generates the most heat and therefore most likely to have a heat sink thereon.

As shown in FIG. 1, the printed circuit board 100 includes a first edge connector 140 and a second edge connector 142. As shown in FIG. 1 there are external traces, such as electrical trace 110, on the external surface 120 of the printed circuit board 100 that connect to certain of the outputs associated with the first edge connector 140. Other traces that connect with the edge connectors 140, 142 will have traces internal to the printed circuit board 100.

Figure 2:
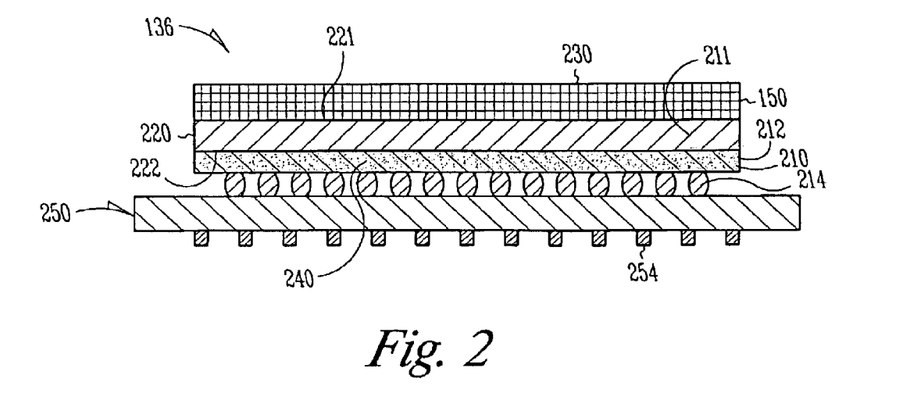
FIG. 2 illustrates a component having a diamond-silicon hybrid integrated heat spreader attached to the die of an integrated circuit, according to an embodiment of this invention.

FIG. 2 illustrates a component 136 having a diamond-silicon hybrid integrated heat spreader 150 attached to the die 210 of an integrated circuit 212, according to an embodiment of this invention. The diamond-silicon hybrid integrated heat spreader 150 may also be termed a heat dissipation device. The heat dissipation device, or diamond-silicon hybrid integrated heat spreader 150, includes a silicon substrate 220 and a layer of diamond 230 attached to the silicon substrate 220. The layer of diamond 230 is deposited on the silicon substrate 220. In some embodiments the deposited diamond is a film having a thickness of approximately 25 to 400 microns. In another embodiment, the diamond film, has a thickness in the range of 50 to 300 microns. In still other embodiments the diamond film forming the layer of diamond 230 has a thickness in the range of 100 to 200 microns.

The diamond layer 230 is deposited on the silicon layer or silicon substrate 220, using a chemical vapor deposition (CVD) process. In one embodiment the CVD process is plasma enhanced. The diamond layer 230 is deposited on a wafer-sized silicon substrate 220 in a vapor deposition chamber. Within the vapor deposition chamber the pressure is 20–50 Torr and the temperature of the chamber is in the range of 800 to 1000° C. The process gasses included within the chamber are methane and hydrogen. The methane levels typically vary in the range of 0.5 to 5%. The diamond layer 230 is deposited onto the wafer-sized silicon substrate 220 at a deposition rate of approximately 10 to 50 microns per hour. As a result it takes from 2 to 10 hours to deposit a diamond film or diamond layer 230 that is 100 microns thick.

Plasma is activated in the chamber using any of a variety of techniques, including a radio-frequency induced glow discharge, DC arc jets, a microwave CVD or other plasma source. Plasma activation is used to induce a plasma field in the deposition gas and provides for low temperatures as well as good film uniformity and through put. The layer of silicon 220 has a thickness in the range from 1 to 40 microns. In other embodiments, the layer of silicon 220 is in the range of 1 to 20 microns, and in still further embodiments, the layer of silicon 220 is in the range of 1 to 10 microns.

The silicon substrate, or layer of silicon 220, has a first major surface 221 to which the diamond film or diamond layer 230 is attached. The diamond or the silicon substrate 220 also has a second major surface 222. The second major surface 222 of the silicon substrate 220 is typically smoothed so that when attached to a surface 211 of the die 210 a connection having a low resistivity to the flow of heat will be formed. In some embodiments the surface 222 of the silicon substrate 220 is removed using a grinding process. The grinding process results in a smooth surface 222 associated with the silicon substrate 220. The grinding process also removes a portion of the silicon substrate 220 from the wafer-sized silicon substrate 220.

As shown in FIG. 2, the wafer-sized silicon substrate 220 and the diamond layer 230 have been cut or diced or singulated to sizes which correspond to the surface area of the surface 211 of the die 210. The heat dissipation device for diamond-silicon integrated heat spreader 150 also includes a thermal interface layer 240. The thermal interface layer 240 may be a metal, such as copper, or a thermal grease. The thermal interface material 240 is used to connect the heat dissipation device or diamond-silicon integrated heat spreader 150 to the die 210. The thermal interface material 240 fills in any air pockets or other spaces that may occur when the heat dissipation device or diamond-silicon integrated heat spreader 150 is placed onto the surface 211 of the die 210. When the heat dissipation device or diamond-silicon integrated heat spreader 150 is placed onto the surface 211 of the die 210, the die 210 and the heat dissipation device or diamond-silicon integrated heat spreader 150 are placed in thermally conductive relation with one another.

The heat dissipation device or diamond-silicon integrated heat spreader 150 is attached to the surface 211 to form an integrated heat sink or heat spreader with the die 210. The surface 211 of the die is also referred to as the back side surface of the die 210. The die 210 also includes a set of leads which may be in one of several forms. As shown in FIG. 2, the leads are balls 214, which are placed in an array. This type of package is referred to as a ball grid array package. The individual balls 214 of the ball grid array electrically contact pads on an organic LAN grid array (OLGA) 250. OLGA is a composite material made of multiple layers of conductive material such as copper and an organic material. The multiple layers of copper are embedded inside the organic material to provide electrical coupling between the integrated circuitry 212 within the die 210 and the electrical circuitry within OLGA 250. The OLGA 250 completes the package. The OLGA 250 includes pins or balls 254 which are used to attach to a printed circuit board 100 (shown in FIG. 1).

Figure 3A:
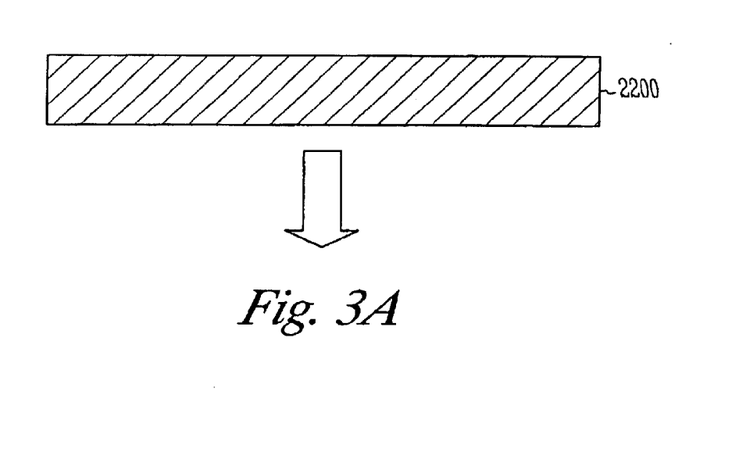
FIG. 3A illustrates a schematic side view of a silicon substrate or wafer at the beginning of a process for forming a diamond-silicon hybrid integrated heat spreader, according to an embodiment of this invention.
Figure 3B:
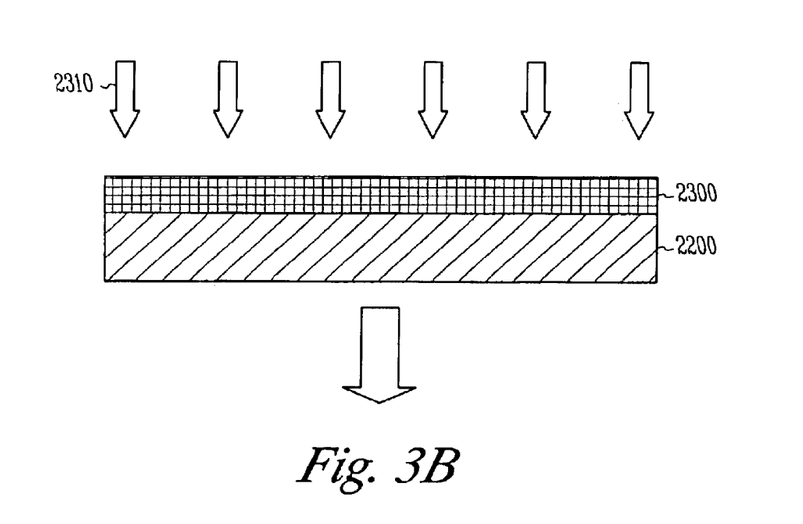
FIG. 3B illustrates a schematic side view of a silicon substrate or wafer after a diamond layer has been deposited thereon during the process for forming a diamond-silicon hybrid integrated heat spreader, according to an embodiment of this invention.
Figure 3C:
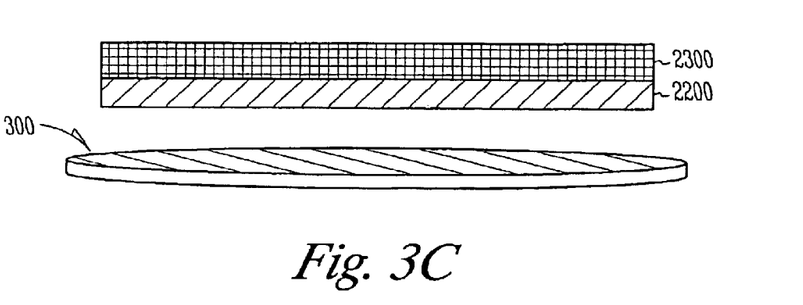
FIG. 3C illustrates a schematic side view of a silicon substrate or wafer after a portion of the silicon has been removed during the process for forming a diamond-silicon hybrid integrated heat spreader, according to an embodiment of this invention.

FIGS. 3A, 3B and 3C show various steps in a process forming a diamond-silicon hybrid integrated heat spreader 150. FIG. 3A illustrates a schematic side view of a silicon substrate or wafer 2200 at the beginning of a process for forming a diamond-silicon hybrid integrated heat spreader, according to an embodiment of this invention. The silicon substrate 2200 is a wafer of silicon which is processed to ultimately form the diamond-silicon hybrid integrated heat spreader 150 shown in FIGS. 1 and 2. The silicon substrate 2200 can be a low-cost substrate fabricated using a polycrystalline silicon wafer.

FIG. 3B illustrates a schematic side view of a silicon substrate or wafer 2200 after diamond layer 2300 has been deposited thereon during the process for forming a diamond-silicon hybrid integrated heat spreader, according to an embodiment of this invention. The arrows carrying the reference number 2310 represent the diamond film or diamond layer 2300 being deposited onto the silicon substrate 2200. As mentioned previously, the diamond layer 2300 is a film formed by plasma-enhanced CVD. The silicon substrate wafer 2200 is placed in an environment or in a deposition chamber having a pressure of 20 to 50 Torr and a temperature of 800 to 1000° C. Process gasses are also placed into the deposition chamber. The process gasses include methane at 0.5 to 5% and hydrogen. Plasma is activated using either a microwave CVD, and radio-frequency glow discharge, or a DC glow discharge, or a DC arc, or similar plasma activation technique. As mentioned previously, the deposition rate of the diamond is from 10 to 50 microns per hour, and therefore to form a film or diamond 100 microns thick takes approximately 2 to 10 hours. Of course if a layer or film of diamond 2300 is formed that is 200 microns thick the time for deposition will be from 4 to 20 hours.

FIG. 3C illustrates a schematic side view of a silicon substrate wafer 2200 with a diamond layer 2300 deposited thereon after a portion of the silicon substrate 2200 has been removed. Also shown in FIG. 3C is a grinding wheel 300. The grinding wheel 300 is used to remove a portion of the silicon substrate 2200 from the wafer. In other words the grinding wheel 300 is used to thin the silicon substrate 2200 to a thickness in the range of 1 to 40 microns. In some embodiments the layer of silicon is thin to the range of 1 to 20 microns, and in still further embodiments the layer of silicon is thin to the range of 1 to 10 microns. It has been found that a thin silicon layer 2200 does not have a significant impact on the thermal characteristics of the diamond-silicon hybrid head spreader 150. Therefore the grinding wheel 300 is used to remove or thin the silicon substrate 2200 so that the silicon layer 220 on the diamond-silicon hybrid integrated heat spreader 150 will have a thickness that will not have a significant impact on the thermal characteristics of the integrated heat sink 150.

Advantageously, the silicon material 2200 of the silicon wafer can be a less expensive silicon, such as a polycrystalline silicon. This provides for a less expensive integrated heat sink, and the silicon also allows for easier handling of the wafer-sized substrate 2200 during the process of forming individual heat sinks 150. Once the silicon substrate 2200 is thinned to a desirable thickness, the silicon substrate 2200, having a diamond layer 2300 thereon, can be diced or singulated to a size and shape approximately equal to the size and shape of a die 210 to which the diamond-silicon hybrid integrated heat spreader 150 will attach.

Figure 4:
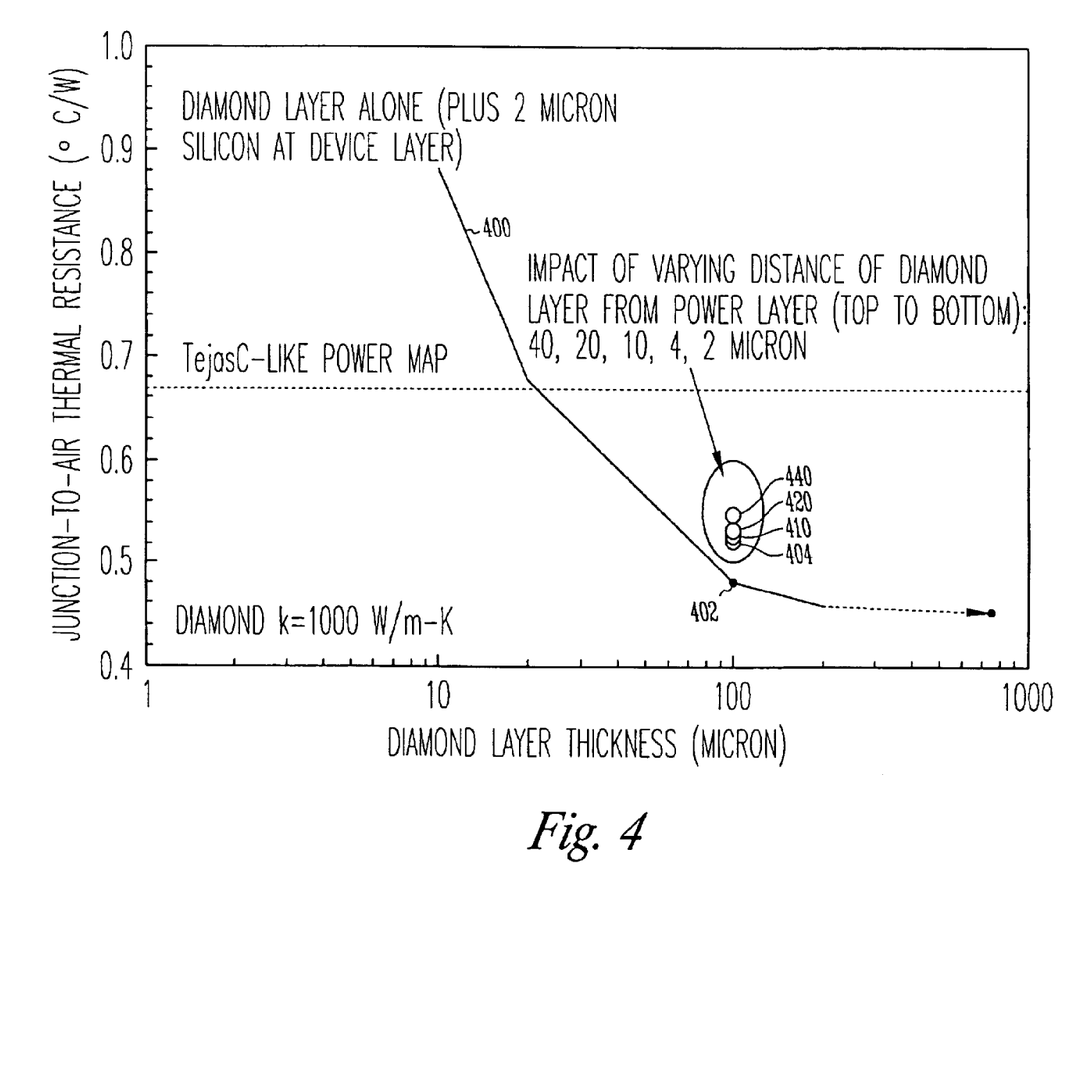
FIG. 4 is a graph of the junction-to-air thermal resistance of an integrated circuit on a diamond silicon hybrid heat spreader versus the diamond layer thickness in microns for a die attached to a diamond-silicon hybrid integrated heat spreader, according to an embodiment of this invention.

FIG. 4 is a graph of the junction-to-air thermal resistance of an integrated circuit on a diamond silicon hybrid heat spreader versus the diamond layer thickness in microns for a diamond-silicon hybrid integrated heat spreader, according to an embodiment of this invention. The graph, shown in FIG. 4, includes a solid line 400 and diamond layer all by itself with a 2 micron thickness layer of silicon at the device. With a diamond layer of 100 microns in thickness, the junction-to-air thermal resistance is shown by point 402 on the solid line 400. Encircled on the graph are four other data points for diamond layer thickness of 100 microns. The four data points include the junction-to-air thermal resistance for a substrate or silicon layer 220 with a thickness of 4 microns as depicted by reference point 404. As shown in FIG. 4, the thermal resistance or varying the distance of diamond from the power layer by 4 microns is approximately 0.52° C./W. Similarly point 410 shows the junction-to-air thermal resistance when you vary the distance of the diamond layer from the power layer by 10 microns. Point 420 shows the impact of varying the distance of the diamond 230 layer from the power layer (back side surface 211 of the die 210 as shown in FIG. 2) by 20 microns. Point 440 on the graph shows the impact of varying the distance of the diamond layer 230 (as shown in FIG. 2) from the power layer by a distance of 40 microns. Thus as can be seen from FIG. 4, the thickness of the layer of silicon or the silicon substrate 220 (as shown in FIG. 2) does have an impact on the ability of the diamond to transfer heat. However, the impact is minimal or small at distances from the power layer in the range from 2 to 40 microns.

Figure 5:
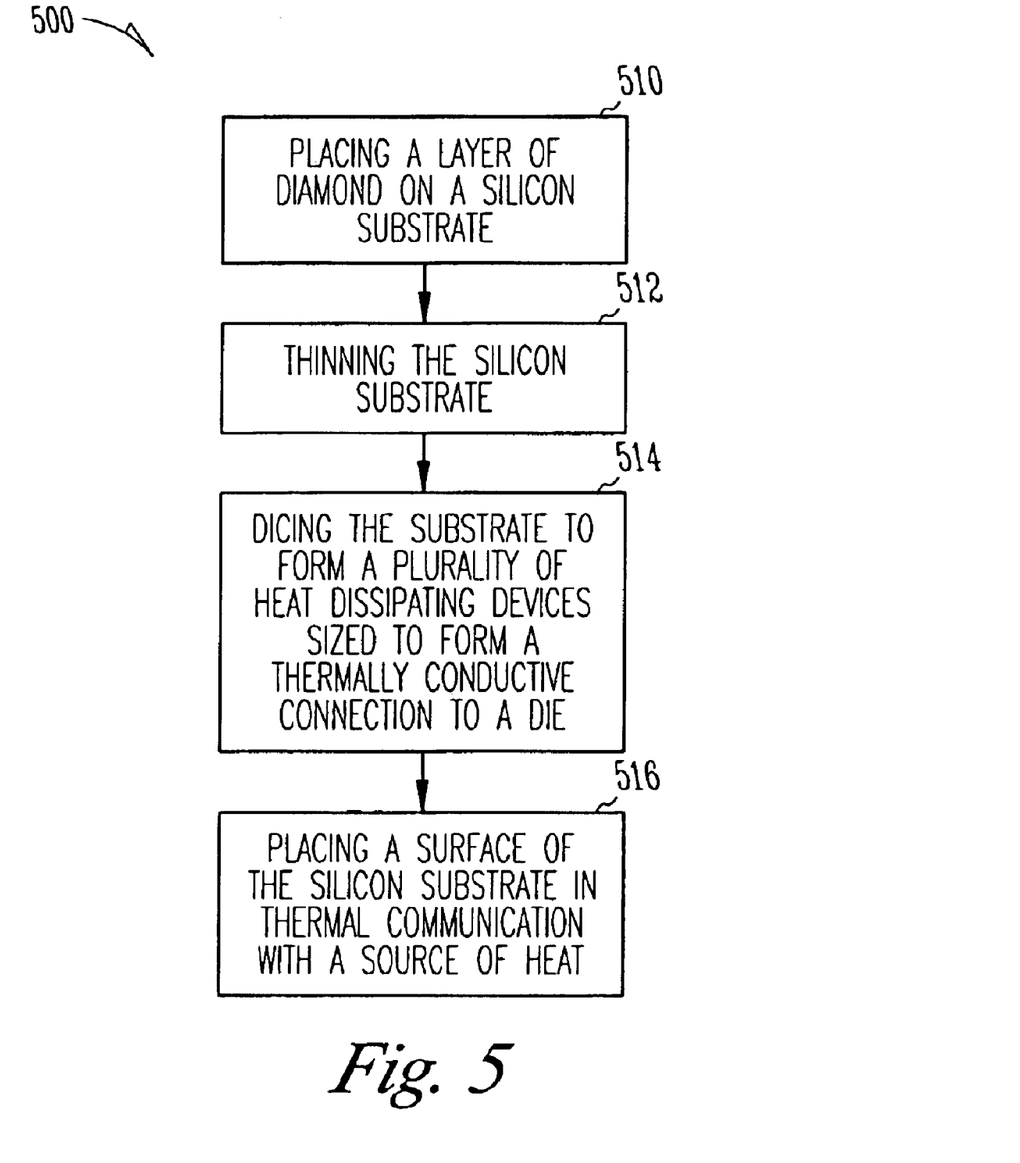
FIG. 5 is a flow diagram of the process for forming a diamond-silicon hybrid integrated heat spreader, according to an embodiment of this invention.

FIG. 5 is a flow diagram 500 of the process for forming a diamond-silicon hybrid integrated heat spreader 150, according to an embodiment of this invention. The method 500 for forming a heat dissipating device or diamond-silicon hybrid heat spreader 150 includes placing a layer of diamond on a silicon substrate 510, and thinning the silicon substrate 512. Thinning the silicon substrate 512 includes grinding a surface of the substrate. Placing a diamond layer onto the silicon substrate 510 further includes depositing a diamond film onto the substrate. Placing a diamond layer onto the silicon substrate 510 further comprises depositing a diamond film onto the substrate using chemical vapor deposition. The method 500 further includes dicing the substrate to form a plurality of heat dissipating devices 150 sized to form a thermally conductive connection to a die 514. The method 500 also includes placing a surface of the silicon substrate 510 in thermal communication with a source of heat 516.

Figure 6:
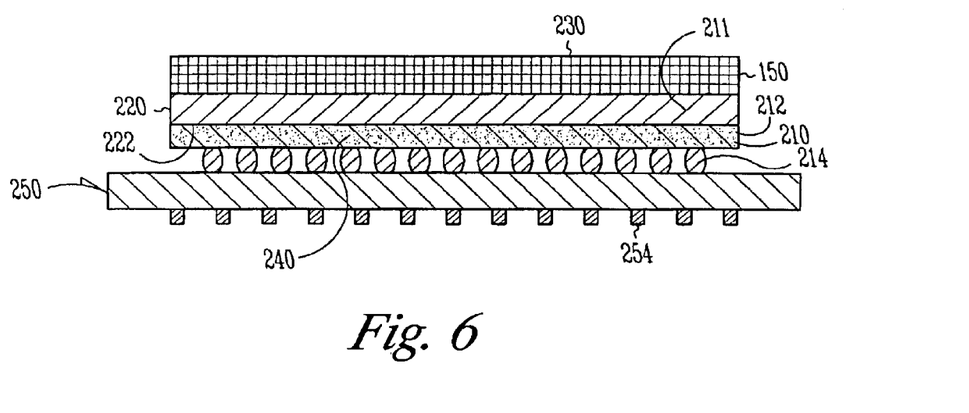
FIG. 6 illustrates a diamond-silicon hybrid integrated heat spreader attached to the die of an integrated circuit, according to another embodiment of this invention.

FIG. 6 illustrates a diamond-silicon hybrid integrated heat spreader 150 attached to the die 210 of an integrated circuit 211, according to another embodiment of this invention. The major components of the diamond-silicon hybrid integrated heat spreader 150 and the die 210 are similar to the diamond-silicon hybrid integrated heat spreader 150 and the die 210 shown in FIG. 2. Accordingly the similar components of the invention will not be discussed for the sake of clarity as well as brevity. The discussion of FIG. 6 will, therefore, key in on the differences between the device shown in FIG. 2 and the device shown in FIG. 6.

One of the differences is that the integrated heat spreader 150, which includes the layer of silicon 220, is directly bonded to the silicon of the surface 211 of the die 210. Direct bonding of silicon to silicon occurs when two highly polished-flat silicon surfaces are brought into contact. Bonding occurs due to the formation of Si—O—Si specie formed between the two silicon surfaces. This occurs as a result of the free surface of silicon adsorbing OH radicals from the atmosphere according to the following reaction: Si—OH+OH—Si>H$_2$O+Si—O—Si. When the structure is heat treated, the oxygen from the H$_2$O forms SiO$_2$, and the hydrogen diffuses into the silicon. The bond strength increases with increasing heat treatment or annealing temperature. It has been found that at temperatures below 400° C., the bond strength between the silicon and silicon is sufficiently strong for the direct bonding of the die to the diamond-silicon hybrid integrated heat spreader 150. It is necessary to keep the temperatures below the point where the solder balls, such as solder balls 214 shown in FIG. 6, will melt or reflow.

Figure 7:
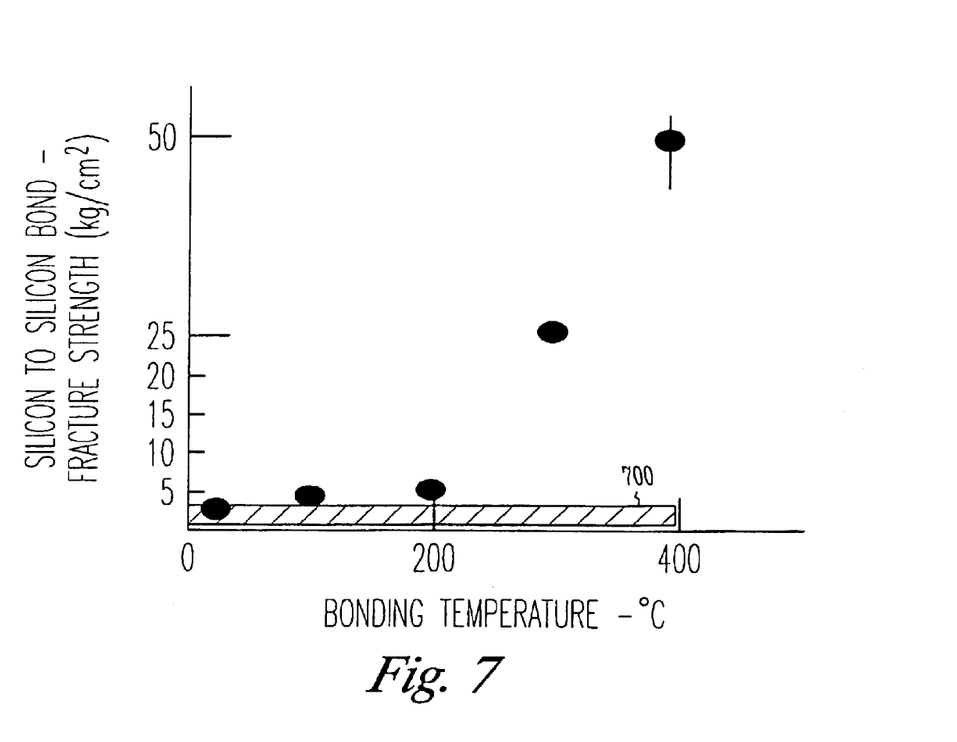
FIG. 7 is a graph of the bonding strength of a silicon to silicon bond versus the bonding temperature according to an embodiment of this invention.

FIG. 7 is a graph of the bonding strength of a silicon to silicon bond versus the bonding temperature according to an embodiment of this invention. FIG. 7 compares the silicon to silicon bond strength, which is annealed at various temperatures, to the bond strength of a thermal interface material. The thermal interface material is using a polymer adhesive such as Shinetsu 7756 polymer adhesive, which has a bond fracture strength of 1.5 to 2.5 Kg/cm$^2$. The bond strength is shown by the bar 700 in the graph of FIG. 7. It can be seen that various bonding temperatures used to anneal the silicon to silicon bond do not have to be very large, such as approximately 25°, in order to have a bond/fracture strength equal to the bond-fracture strength associated with the polymer thermal interface material 700. When the silicon to silicon bond is annealed at 100° C., the bond-fracture strength is greater than the bond-fracture strength associated with the polymer thermal interface material. At 200° C. anneal of a silicon to silicon bond, the bond fracture strength outperforms the polymer material. Similarly, the bond strength of the silicon to silicon bond forms a bond 10 times stronger (at approximately 25 Kg/cm$^2$) when the bond is annealed at 300° C. than the bond-fracture strength associated with the polymer thermal interface material. The bond strength of the silicon to silicon bond is approximately 50 Kg/cm$^2$ when the silicon to silicon bond is annealed at slightly less than 400° C., which is also slightly less than the melting point of solder on leads in dies.

The use of a silicon to silicon bond has several advantages over the use of a thermal interface material for bonding the integrated heat sink 150 to the die 210. Among the advantages is the elimination of a coefficient of thermal expansion mismatches. One of the common thermal interface materials is copper or copper cladding. Copper has a coefficient of thermal expansion in the range of 15 to 17 parts per million per degree centigrade. Diamond has a coefficient of thermal expansion of 1 to 2 PPM per degree centigrade, and silicon has a coefficient of thermal expansion in the range of 3 to 4 PPM per degree centigrade. Thus, when a silicon to silicon bond is used to attach the diamond-silicon hybrid integral heat spreader 150 to a die 210, thermal interface material with the highest coefficient of thermal expansion is removed. This leaves a silicon to silicon bond, both of which have the same thermal coefficient of expansion, and the layer of diamond attached to the substrate of silicon 220 that has a coefficient of thermal expansion which is much closer to the coefficient of thermal expansion of silicon. The elimination of the thermal interface also eliminates the thermal resistances introduced by the thermal interface material and the two contact resistances. The use of the diamond-silicon composite heat spreader results in significantly improved thermal performance as a result of the significantly higher conductivity of diamond as compared to copper.

An electronic device includes a die further having a first major surface, and a second major surface. The electronic device also includes a plurality of connectors associated with the first major surface of the die, and an integrated heat spreader in thermally conductive relation with the second major surface of the die. The integrated heat spreader also has a layer of silicon, and a layer of diamond attached to the layer of silicon. The first major surface of the die attached to a printed circuit board. In some embodiments, the layer of silicon is in the range of 1 to 40 microns. In other embodiments, the layer of silicon is in the range of 1 to 20 microns, and in still further embodiments, the layer of silicon is in the range of 1 to 10 microns. In some embodiments, the layer of diamond is in the range of 50 to 400 microns. In other embodiments, the layer of diamond is in the range of 75 to 300 microns, and in still further embodiments, the layer of diamond is in the range of 100 to 200 microns.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method for dissipating heat from a device comprising:
   placing a layer of diamond on a silicon substrate;
   thinning the silicon substrate; and
   placing the silicon substrate on a silicon surface of the device.

2. The method of claim 1 wherein thinning the silicon substrate includes grinding a surface of the substrate.

3. The method of claim 1 wherein placing the diamond layer onto the silicon substrate further comprises depositing a diamond film onto the substrate.

4. The method of claim 1 wherein placing the diamond layer onto the silicon substrate further comprises depositing a diamond film onto the substrate using chemical vapor deposition.

5. The method of claim 1 further comprising dicing the substrate to form a plurality of heat dissipating devices sized to form a thermally conductive connection to a die.

6. The method of claim 1 further comprising placing a surface of the silicon substrate in thermal communication with a source of heat.

7. A method of bonding a heat sink to a die comprising:
   providing a silicon layer on the heat sink;
   placing the silicon layer of the heat sink onto the back side of the die; and
   heat treating the heat sink and die to strengthen the bond.

8. The method of claim 7 wherein the heat treatment transfers less heat than needed to reflow solder.

9. The method of claim 7 wherein providing a silicon layer on a heat sink includes:
   placing a layer of diamond on a silicon substrate; and
   thinning the silicon substrate.

10. The method of claim 9 wherein placing the diamond layer onto the silicon substrate further comprises depositing a diamond film onto the substrate.

11. The method of claim 9 wherein placing the diamond layer onto the silicon substrate further comprises depositing a diamond film onto the substrate using chemical vapor deposition.

12. The method of claim 9 further comprising dicing the substrate to form a plurality of heat dissipating devices sized to form a thermally conductive connection to a die.

13. The method of claim 1 further comprising placing a thinned surface of the silicon substrate in thermal communication with a source of heat.

14. The method of claim 1 wherein thinning the silicon substrate includes grinding a surface of the substrate to a thickness within a range of thicknesses where the heat transfer rate of the diamond layer is substantially the same.

15. The method of claim 1 further comprising direct bonding the silicon substrate to the silicon surface of the device.

16. The method of claim 1 wherein placing the silicon substrate includes exposing the layer of diamond on the silicon substrate as an exterior surface.

17. The method of claim 1 wherein placing the silicon substrate includes positioning the layer of diamond as an exterior surface.

18. The method of claim 1 wherein the device is a die.

19. A method for forming a heat dissipating device comprising:
   placing a layer of diamond on a silicon substrate by depositing a diamond film onto the substrate using chemical vapor deposition; and
   thinning the silicon substrate.

20. The method of claim 19 wherein thinning the silicon substrate includes grinding a surface of the substrate.

21. The method of claim 19 further comprising dicing the substrate to form a plurality of heat dissipating devices sized to form a thermally conductive connection to a die.

22. The method of claim 19 further comprising placing a surface of the silicon substrate in thermal communication with a source of heat.

* * * * *